(12) United States Patent
Chainer et al.

(10) Patent No.: US 7,856,495 B2
(45) Date of Patent: Dec. 21, 2010

(54) IDENTIFICATION OF EQUIPMENT LOCATION IN DATA CENTER

(75) Inventors: Timothy Joseph Chainer, Putnam Valley, NY (US); Hien Phu Dang, Nanuet, NY (US)

(73) Assignee: International Business Machines Corporation, Armonk, NY (US)

( * ) Notice: Subject to any disclaimer, the term of this patent is extended or adjusted under 35 U.S.C. 154(b) by 831 days.

(21) Appl. No.: 11/776,268

(22) Filed: Jul. 11, 2007

(65) Prior Publication Data

US 2009/0017816 A1    Jan. 15, 2009

(51) Int. Cl.
*G06F 15/173* (2006.01)
(52) U.S. Cl. .................. 709/223; 340/524; 340/500
(58) Field of Classification Search ............. 340/500, 340/524, 584; 709/223; 455/425
See application file for complete search history.

(56) References Cited

U.S. PATENT DOCUMENTS

| | | | | |
|---|---|---|---|---|
| 6,881,142 | B1* | 4/2005 | Nair | 454/186 |
| 7,315,768 | B2* | 1/2008 | Dang et al. | 700/276 |
| 7,366,632 | B2* | 4/2008 | Hamann et al. | 702/130 |
| 7,383,148 | B2* | 6/2008 | Ahmed | 702/127 |
| 7,548,833 | B2* | 6/2009 | Ahmed | 702/188 |
| 2004/0268166 | A1* | 12/2004 | Farkas et al. | 713/320 |
| 2005/0113978 | A1* | 5/2005 | Sharma et al. | 700/259 |
| 2005/0173549 | A1* | 8/2005 | Bash et al. | 236/51 |
| 2006/0171538 | A1* | 8/2006 | Larson et al. | 380/270 |
| 2009/0077166 | A1* | 3/2009 | Chu et al. | 709/203 |

OTHER PUBLICATIONS

Datacome Equipment, "Power Trends and Cooling Applications," American Society of Heating, Refrigerating and Air-Conditioning Engineers, Inc., 2005, 115 pages.

* cited by examiner

*Primary Examiner*—Eric M Blount
(74) *Attorney, Agent, or Firm*—Vazken Alexanian; Ryan, Mason & Lewis, LLP (57) ABSTRACT

Techniques are disclosed for identifying the locations of equipment in computing environments such as data centers. For example, a method of identifying a plurality of computing devices in a computing environment includes the following steps. A first temperature-indicative map of the plurality of computing devices is generated while the plurality of computing device is in a first mode. The first temperature-indicative map is overlaid with a facility map associated with the computing environment. A first one of the plurality of computing devices is placed into a second mode. The second temperature-indicative map of the plurality of computing devices is generated while the first one of the plurality of computing devices is in the second mode and the remainder of the plurality of computing devices is in the first mode. The second temperature-indicative map is overlaid with the facility map associated with the computing environment. The first temperature-indicative map is compared with the second temperature-indicative map to determine a location of the first one of the plurality of computing devices.

20 Claims, 9 Drawing Sheets

IDENTIFICATION OF EQUIPMENT LOCATION IN DATA CENTER

CROSS REFERENCE TO RELATED APPLICATIONS

This application is related to the U.S. patent application Ser. No. 11/776,262, entitled "Identification of Equipment Location in Data Center," filed concurrently herewith, and the disclosure of which is incorporated by reference herein.

FIELD OF THE INVENTION

The present application relates to data centers and, more particularly, to techniques for identifying locations of equipment in such data centers.

BACKGROUND OF THE INVENTION

Currently, virtualization is an important topic in the IT (Information Technology) industry. The promise of virtualization is the ability to manage multiple computing devices (e.g., servers) in order to optimize a certain metric. The most common metric is server utilization, i.e., workload is arranged in such a way that the CPU (central processing unit) is not in contention for resources and is able to achieve maximum throughput. For this kind of optimization, the locations of the servers are not important.

A new metric to optimize is the power consumption. There are two reasons: (1) rising cost of energy; and (2) new servers such as computer blades consume over 30 kilowatts (kW) of power per rack. This power consumption exceeds the limit of the local power grid in many existing data centers.

To save energy, non-peak workload could be consolidated into a smaller number of servers and idle servers could be powered down. On the other hand, to satisfy the power constraint, workload could be spread over several servers to keep the power and thermal demands (power capping) within the capacity of the facility. These two important optimizations can only be done if the physical locations of the servers are known. This is not the case today. Large data centers can have hundreds to thousands of servers, installed at different times and made by different vendors. There is no way to automatically determine the locations of these servers.

During the installation phase, usually it is the facility engineer who decides where to locate the equipment based on the power and thermal requirements. After that, the system administrator generates a logical name for the machine. Each machine can have one or many logical names depending on the application. From then on, the system management software only deals with the machine names and it does not know about their physical locations. That is why, in many existing data centers, the exact location of each server is not known.

Accordingly, techniques are needed for identifying locations of equipment in such data centers.

SUMMARY OF THE INVENTION

Principles of the invention provide techniques for identifying the locations of equipment in computing environments such as data centers.

For example, in a first aspect of the invention, a method of identifying a location of at least one computing device in a computing environment, including a plurality of computing devices, includes the following steps. A first representation of temperature conditions associated with the plurality of computing devices is obtained while the at least one computing device is in a first mode. The at least one computing device is placed into a second mode. A second representation of temperature conditions associated with the plurality of computing devices is obtained while the at least one computing device is in the second mode. The location of the at least one computing system is determined using the first representation and the second representation.

The first mode may be one of a normal operating mode and an idle mode, and the second mode may be the other of the normal operating mode and the idle mode.

The respective steps of obtaining the first and second representations of temperature conditions associated with the plurality of computing devices may further include using at least one thermal imaging device to capture the first and second representations. In such an embodiment, the first and second representations include respective thermal images taken by the at least one thermal imaging device of temperature conditions of heat-conducting elements attached to exhaust fans of the plurality of computing devices. The heat-conducting elements may be plastic strips. When a computing device includes more than one exhaust fan, the corresponding plastic strips may be distinguishable from one another based on at least one of unique shapes and unique sizes.

The method may further include the step of iteratively cycling each of the computing devices from the first mode to the second mode such that first and second representations can be obtained from which locations of each of the computing devices can be determined.

In another embodiment, the respective steps of obtaining the first and second representations of temperature conditions associated with the plurality of computing devices may further include using at least one optical imaging device to capture the first and second representations. In such case, the first and second representations include respective optical images of positions of elements mounted near exhaust fans of the plurality of computing devices.

In yet another embodiment, the respective steps of obtaining the first and second representations of temperature conditions associated with the plurality of computing devices may further include using a wireless transmitter/receiver arrangement to capture the first and second representations. The arrangement may be an infrared transmitter/receiver arrangement.

Given the determined location of the at least one computing device, a power management operation or a troubleshooting operation may be performed.

In a second aspect of the invention, a method of identifying locations of a plurality of computing devices in a computing environment includes the following steps. A first temperature-indicative map of the plurality of computing devices is generated while the plurality of computing devices is in a first mode. The first temperature-indicative map is overlaid with a facility map associated with the computing environment. A first one of the plurality of computing devices is placed into a second mode. A second temperature-indicative map of the plurality of computing devices is generated while the first one of the plurality of computing devices is in the second mode and the remainder of the plurality of computing devices is in the first mode. The second temperature-indicative map is overlaid with the facility map associated with the computing environment. The first temperature-indicative map is compared with the second temperature-indicative map to determine a location of the first one of the plurality of computing devices.

Given the determined location of the first one of the plurality of computing devices, the method further includes the steps of obtaining a thermal image of another portion of the first one of the plurality of computing devices, and taking at least one action with respect to the first one of the plurality of computing devices based on the obtained thermal image.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Illustrative embodiments of the invention provide equipment location identification techniques using a plurality of imaging devices which are strategically located in the proximity of the equipment being monitored. For example, a network of cameras may be placed on a ceiling (of a data center) below which servers to be monitored are located. As used herein, the phrase "data center" refers to any computing environment in which one or more computing devices are located. A data center may comprise more than one facility. Such computing devices may be servers, but principles of the invention are not limited to any particular computing equipment.

It also assumed that system management software that controls the servers has the ability to sequentially put each server in and out of an idle mode (i.e., a mode wherein the server is not processing data as part of its normal data center function).

In a thermal camera embodiment, thermal images of the equipment, or some part of the equipment (as will be explained below), are taken before and during the idle mode. These thermal images are used to pin-point the location of the equipment within the facility. The idea is that a piece of equipment that is in idle mode will generate less heat, and thus produce a less pronounced thermal image, than a piece of equipment that is processing data as part of its normal data center function (i.e., normal operating mode).

It is to be appreciated that thermal cameras can also be used for other purposes such as thermal load balancing or detecting higher-than-normal operating conditions which could be a precursor to equipment failure.

Regular optical cameras can also be used in place of the thermal camera (or even in combination therewith). In such an embodiment, the optical camera is positioned such that an image of a cooling fan area of the equipment can be captured before and during idle mode. Thus, the idea in this embodiment is that if the fan of the equipment can be turned off or slowed down during idle mode, than images of the fan area can be used to determine whether the equipment is in the idle mode or the operating mode.

The non-invasive equipment location techniques of the invention can be used on any equipment that can be remotely controlled.

Figure 1A:
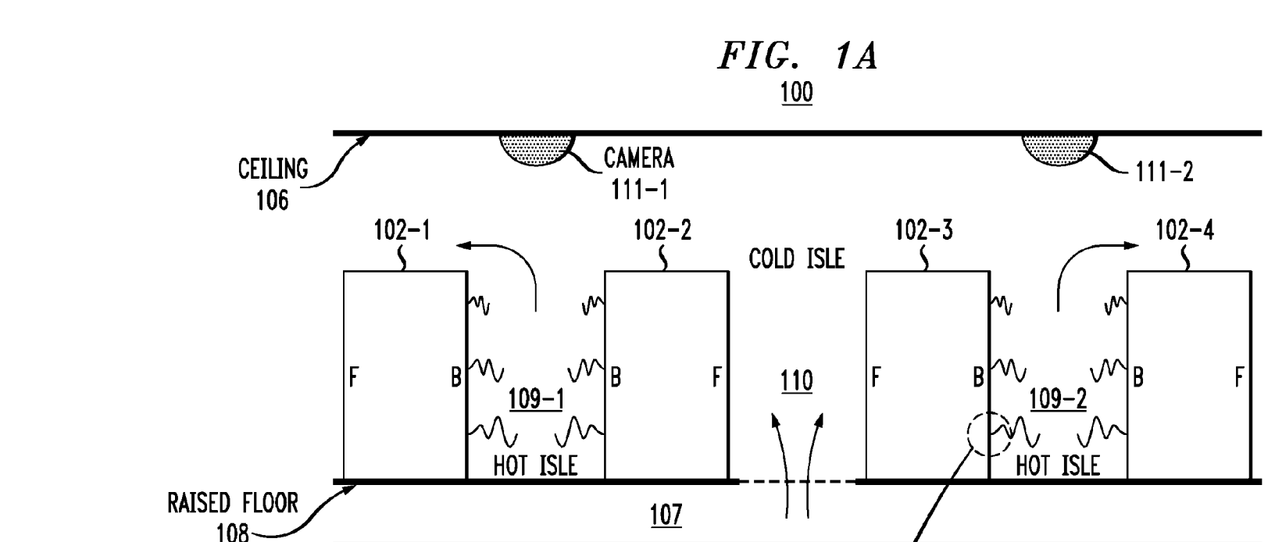
FIG. 1A illustrates a data center in which equipment location identification is implemented according to an embodiment of the invention.

FIG. 1A illustrates one embodiment of a data center in which principles of the invention may be implemented.

As shown, data center 100 comprises a plurality of servers 102-1 through 102-4 arranged in rows with isles in between the rows. It to be understood that only four servers are shown for the sake of clarity, however, the invention is not limited to any particular number. That is, there may be more or less rows of servers, and each row may have more than one server. Also, the servers need not be in a row arrangement, but rather may be in other arrangements.

The facility includes ceiling 106 and raised floor 108. As is known, cabling (to and from the servers) and cooling ducts are typically located in area 107 under the raised floor.

As is known, cool air is blown in from cooling ducts below the raised floor (attached to the air conditioning unit or CRAC (not shown) of the data center) and into the cold isle 110. The servers draw the cool air from the cold isle in through their fronts (F). Hot air exhausts from the backs (B) of the servers into the hot isle (109-1 and 109-2). The hot air rises above the equipment racks and is drawn back to the air conditioning unit.

In accordance with one embodiment of the invention, a camera (111-1 and 111-2) is mounted on top of each hot isle to monitor plastic strips attached to exhaust vents of the servers. Again, it is to be understood that two cameras are shown for the sake of clarity, however, principles of the invention are not limited to any particular number of cameras. Also, other types of devices can be used to indicate fan movement other than plastic strips.

Figure 1B:
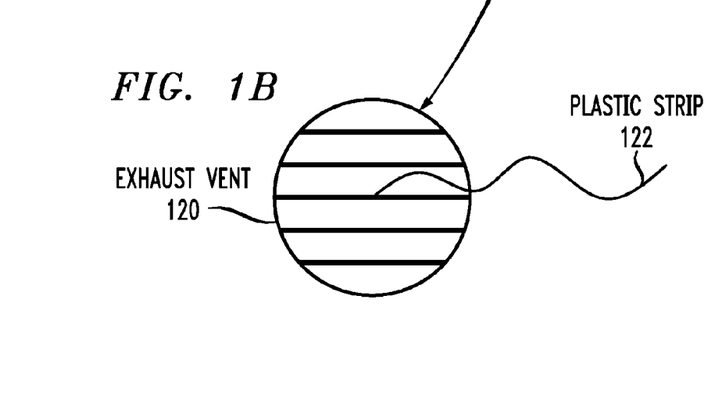
FIG. 1B illustrates an exhaust vent and a plastic strip for use in accordance with the embodiment of FIG. 1A.

FIG. 1B illustrates a partial view of the back of each server, including exhaust vent 120 and plastic strip 122 attached thereto. It is understood that the server typically includes multiple processing units vertically stacked in an equipment rack configuration. As such, each processing unit may have its own exhaust vent and plastic strip. As such, plastic strips are shorter at the top of the rack and get progressively longer at the bottom of the rack. In this manner, the camera can see all strips from the top. For example, the plastic strips could come in three lengths: short, medium and long. A short strip is used on the server at the top of the rack, a medium strip on the middle, and a long strip at the bottom. If there is more than one fan per processing unit, the user could choose to install the plastic strip on only one fan (preferably the main fan) or use the strips of the same length but different widths.

Cameras 111-1 and 111-2 can be stationary or rotatable, depending on the dimension of the isle and the camera lens. A preferred embodiment is a fixed camera. Two types of camera can be used: thermal and optical.

Figure 2:
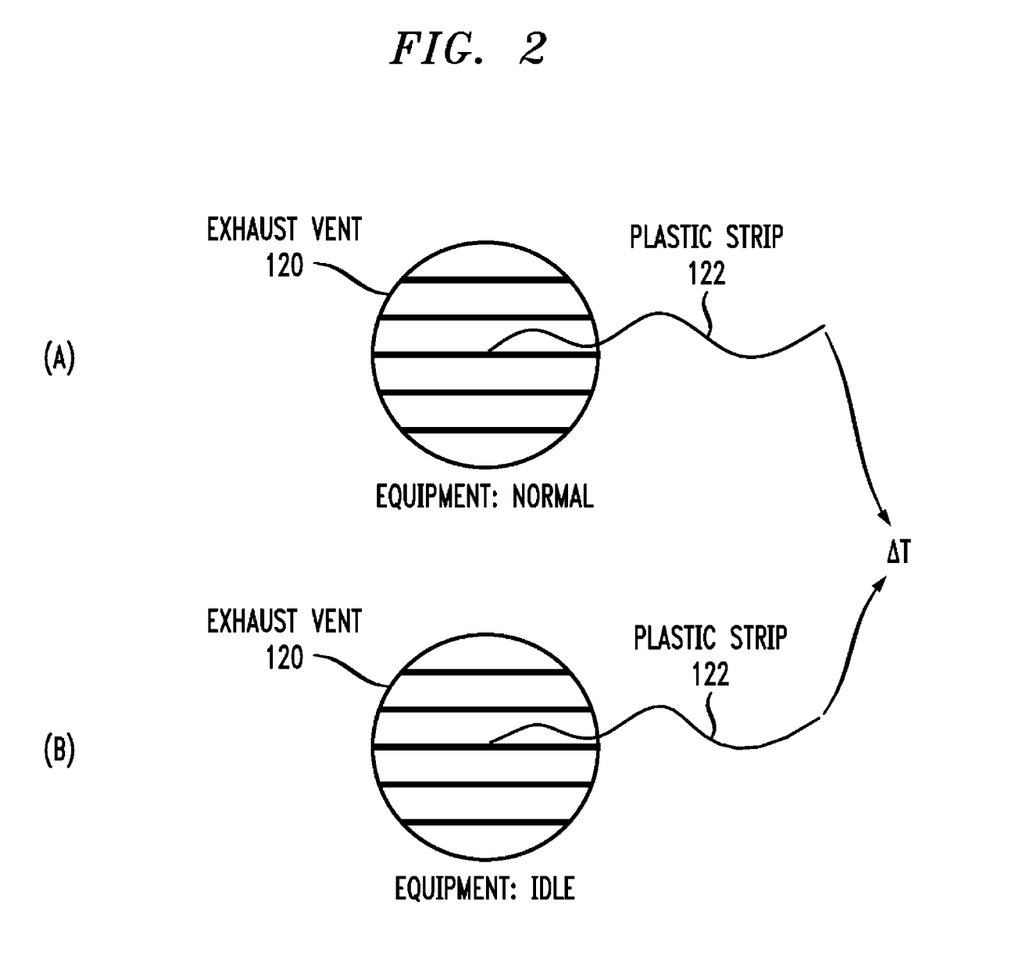
FIGS. 2A and 2B illustrate temperature difference between normal operating mode and idle mode according to an embodiment of the invention.

With a thermal camera, the modes of the servers (i.e., idle or operating) can be inferred from the temperatures of the strips. The temperature of the strip should be at the same temperature as the exhaust air, which is hotter during normal operating mode (FIG. 2A) as compared with idle mode (FIG. 2B). Thus, images of the strips taken by the thermal cameras can be viewed by facility personnel for temperature differences ($\Delta T$) to determine which processing units of the servers are in idle mode and which are in normal operating mode. One or more thermal images may be used to form a thermal map.

Figure 3:
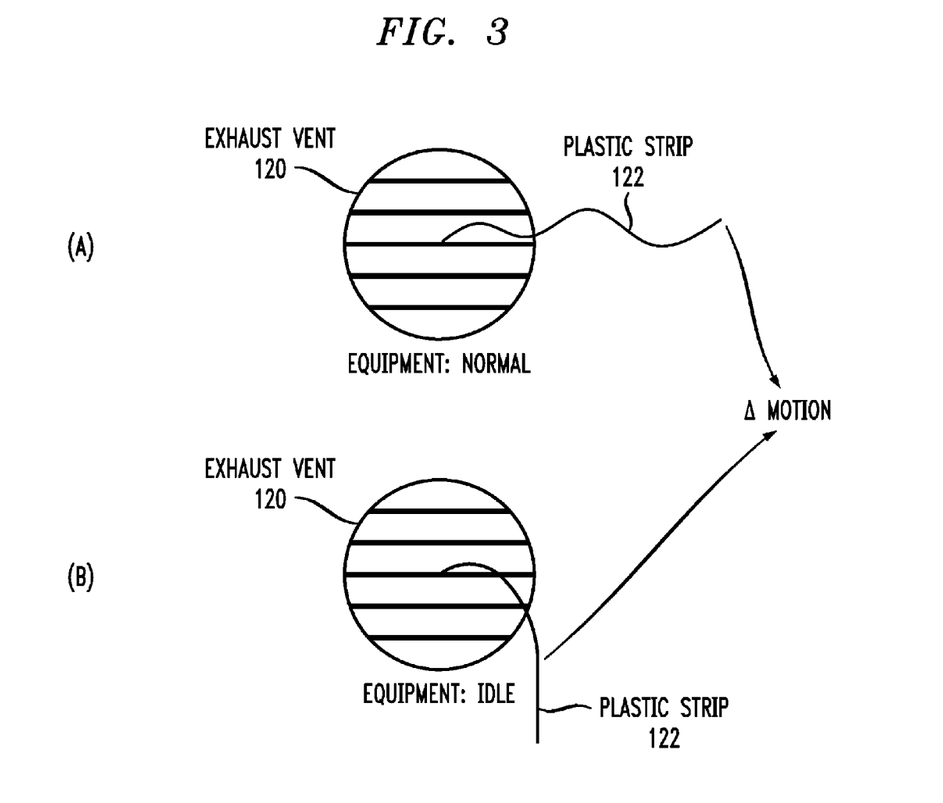
FIGS. 3A and 3B illustrate motion difference between normal operating mode and idle mode according to an embodiment of the invention.

With an optical camera, the motion of the plastic strip is indicative of the mode. That is, a moving strip (FIG. 3A) indicates the fan is operating and thus the server is in normal operating mode. A non-moving or barely moving strip (FIG. 3B) indicates the fan is not operating or operating in a reduced capacity and thus the server is in the idle mode. This embodiment works on a machine that slows down (or stops) the fan speed in idle mode. Thus, images of the strips taken by the optical cameras can be viewed by facility personnel for motion differences ($\Delta$ Motion) to determine which processing units of the servers are in idle mode and which are in normal operating mode. One or more optical images may be used to form an optical map.

Optical cameras are typically less expensive than thermal cameras. However, thermal cameras are more versatile and can be used for other purposes (as will be explained below).

For the remainder of the detailed description, it is assumed that thermal cameras are used, but it is straightforward to adapt the inventive methodologies for the optical camera case.

Figure 4:
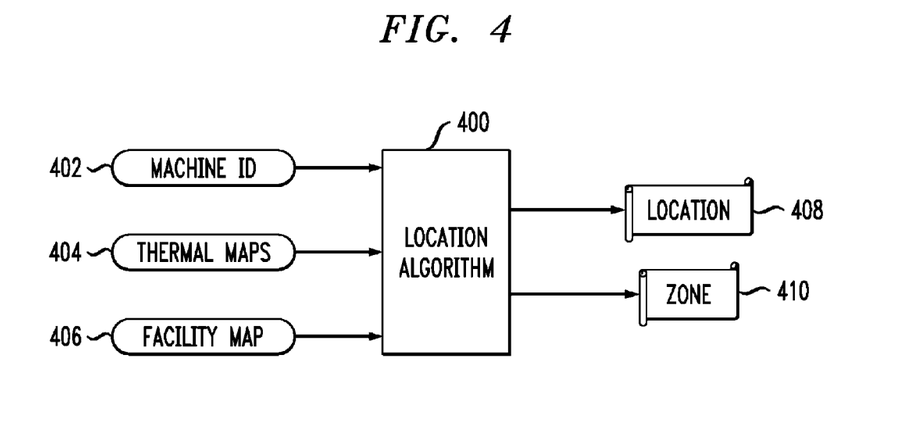
FIG. 4 illustrates inputs and outputs of a location algorithm according to an embodiment of the invention.

FIG. 4 illustrates a methodology for identifying the location of equipment in a data center, according to an embodiment of the invention. As shown, location algorithm 400 inputs machine identifiers (IDs) 402, thermal maps 404 and facility map 406, and determines location 408 of each machine and which zone 410 it is in.

Machine IDs are the IDs of each machine in the data center. The term "machine" depends on the data center equipment. A "machine" may refer to a server, or where each server has multiple processing units (as described above), a "machine" may refer to a processing unit. In any event, a unique identifier is pre-assigned to each machine. The thermal maps are the images taken by the thermal cameras (e.g., 111-1 and 111-2 in FIG. 1A). The facility map has the dimensions of the room and shows the locations of major items such as entrances, exits, air conditioning units, isles, rows of equipment and camera locations. This facility map also contains information on which locations belong to which zones.

Figure 5:
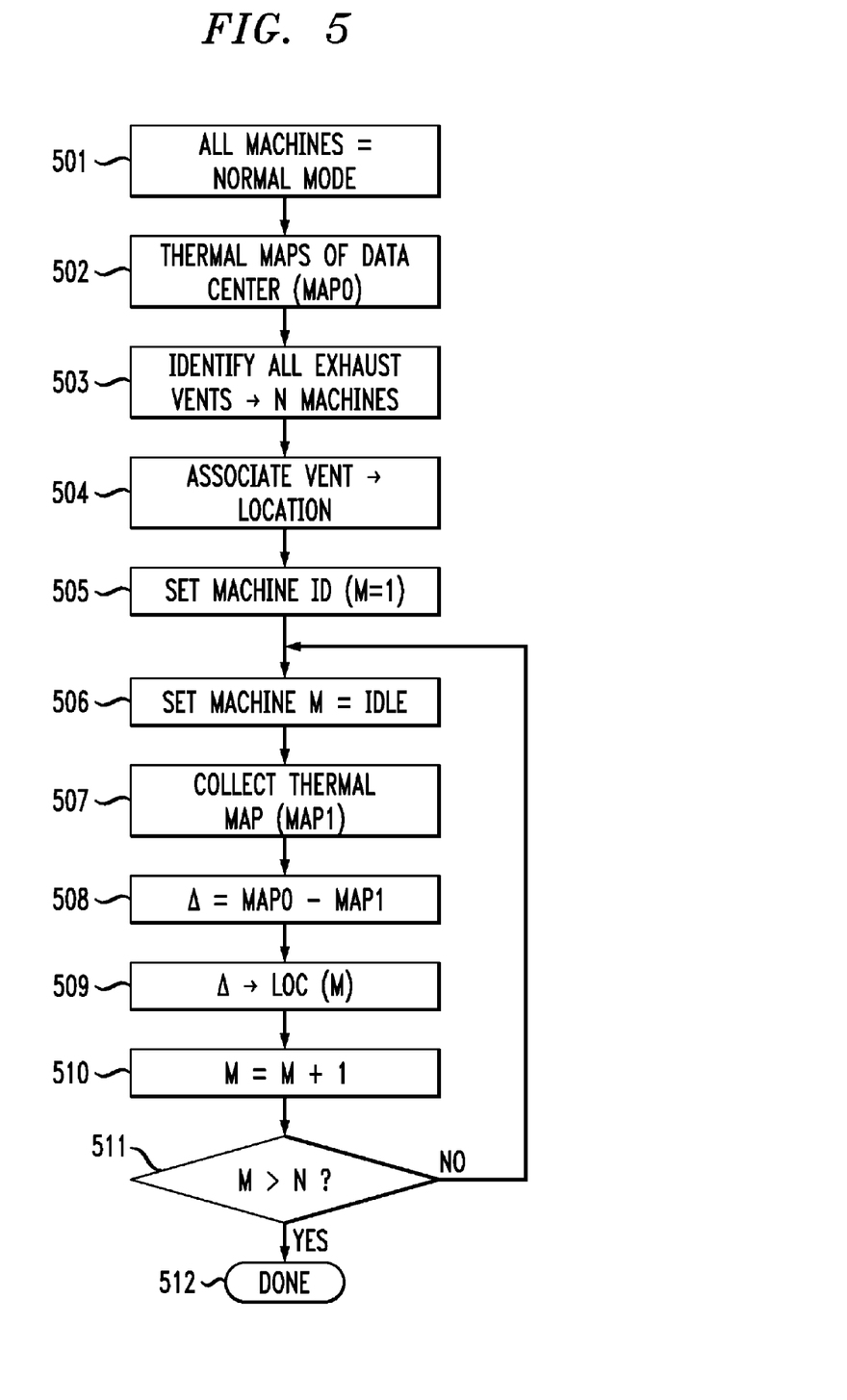
FIG. 5 illustrates a location algorithm according to an embodiment of the invention.
Figure 6:
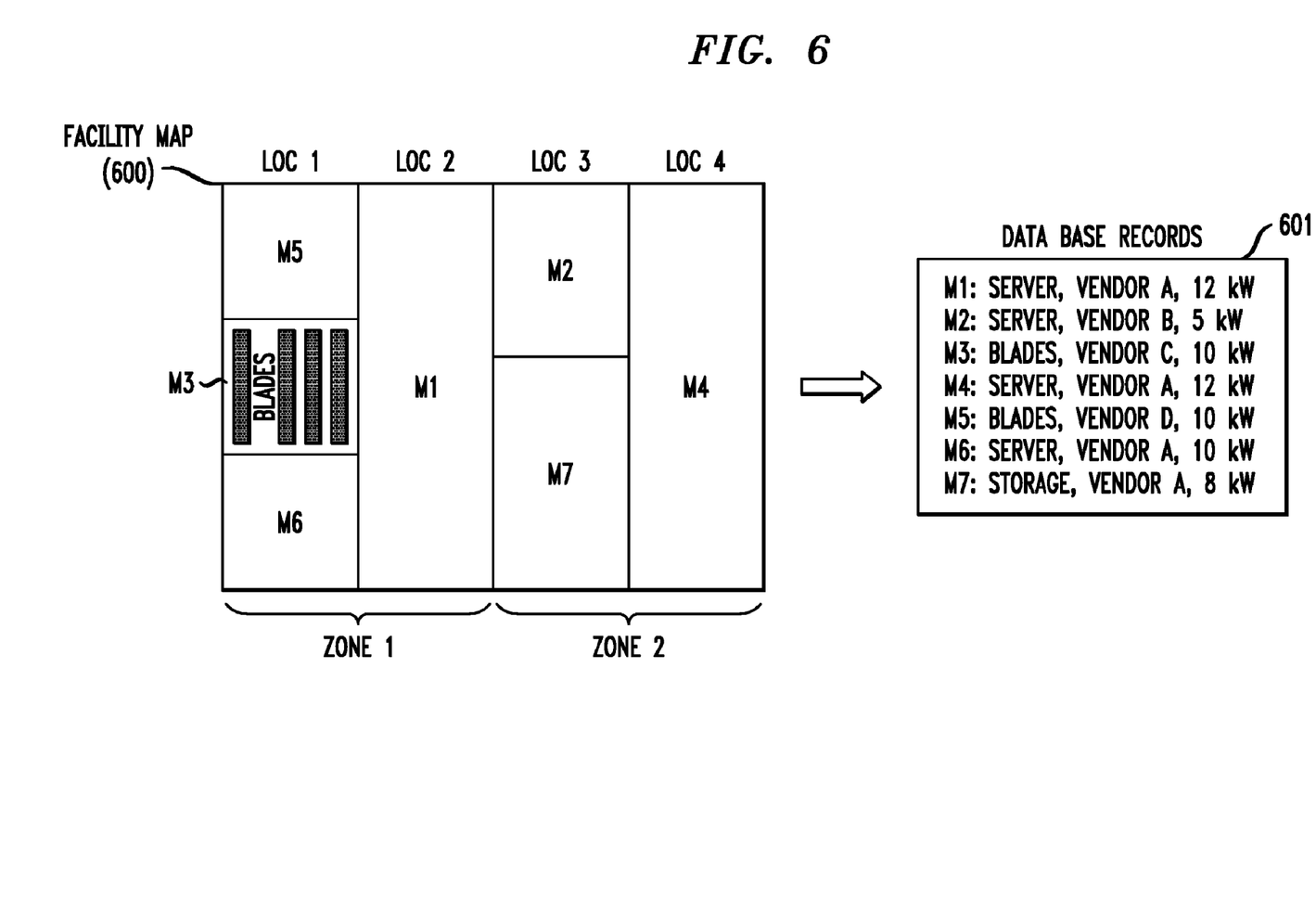
FIG. 6 illustrates part of a facility map and data base records for use in accordance with an embodiment of the invention.
Figure 7:
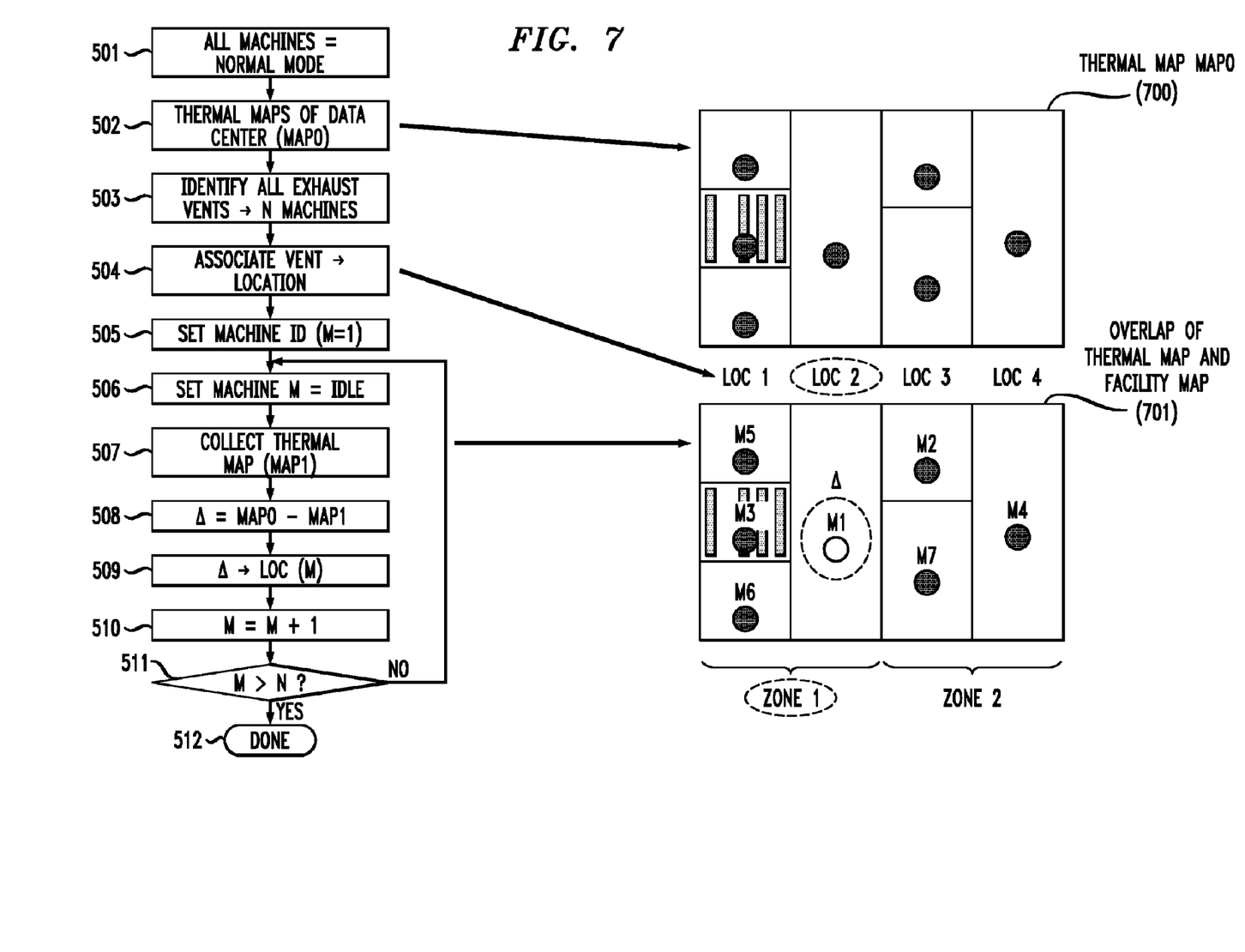
FIG. 7 illustrates the operation of the location algorithm of FIG. 5 with respect to an overlay of a thermal map and facility map according to an embodiment of the invention.

FIG. 5 illustrates the location algorithm in more detail, and refers to an example, shown in FIGS. 6 and 7. That is, given the setup shown in FIG. 6, steps 501 through 502 of FIG. 5 are performed, as detailed in FIG. 7.

Facility map 600 in FIG. 6 shows that there are seven machines installed in four racks at locations (Loc) 1, 2, 3 and 4. Locations 1 and 2 belong to zone 1. Similarly, locations 3 and 4 are in zone 2. Each zone has its own air conditioning unit. The system administrator sets up data base records 601 listing the machine IDs, machine types, manufacturer names and power consumption levels. At this point, the locations and zone numbers are not in the data base and are not known to the system management software. Identification of such locations and zones are determined in accordance with the invention, and then added to the data base records.

FIG. 7 shows how the location algorithm is applied to this setup. With all machines operating in normal operating mode (501), thermal map Map0 (502) identifies seven exhaust vents (503), corresponding to the seven machines. Each vent is represented as a shaded circle on the map. Note that the thermal map can be generated in a straightforward manner from the thermal images of the plastic strips taken above the equipment, as explained above in the context of FIGS. 1A through 2B.

By overlaying Map0 with the facility map (overlay depicted as 701), the locations of the vents can be resolved (504). Now, individual machine can be cycled to idle mode, starting with the first machine by setting M=1 (505 and 506). After a short delay for the exhaust temperature to drop) the thermal cameras yield another thermal map, Map1 (507), which can overlaid with the facility map. The difference between Map0 and Map1 is the vent of machine1 (508)—depicted as the clear circle on the overlay map. This can be translated (509) to location and zone numbers (Loc 2, Zone 1). The same process is repeated for other machines (510 and 511 are used to iterate until all locations and zones are determined). The process then ends (512).

Figure 8:
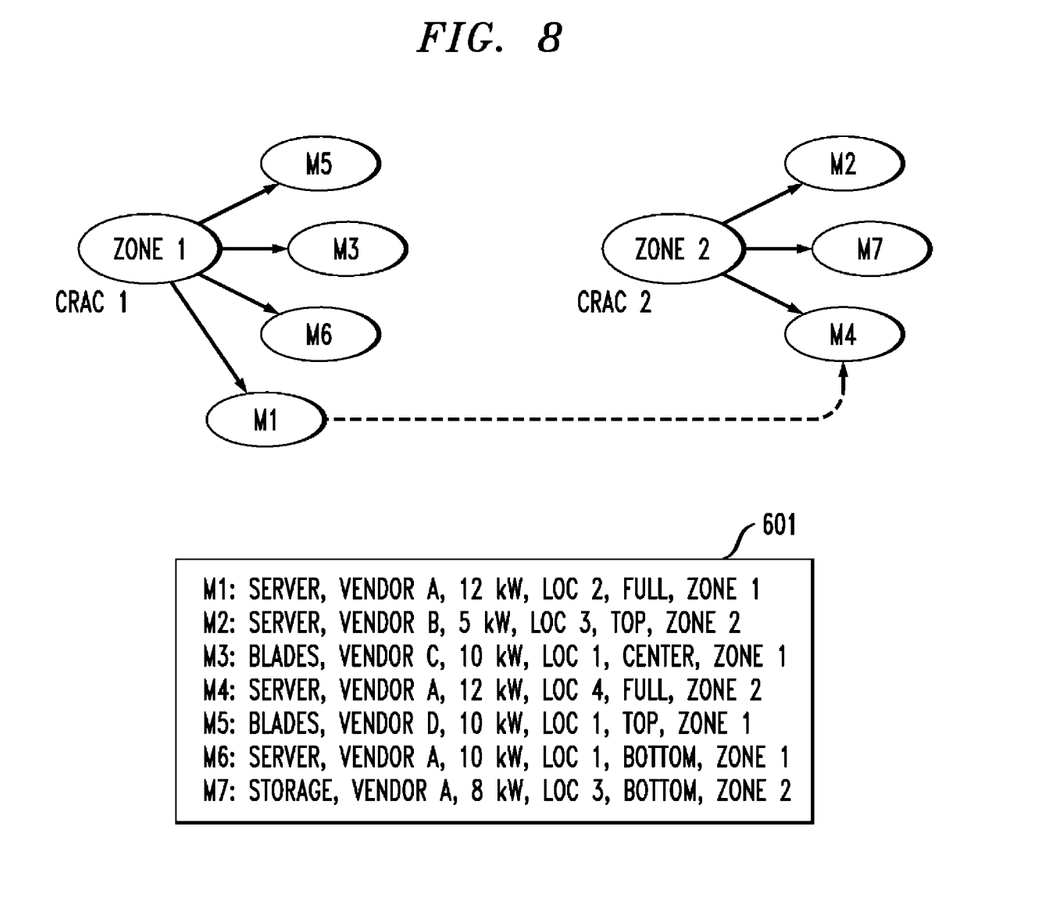
FIG. 8 illustrates updated data base records and an example of management of servers based on power consumption according to an embodiment of the invention.

As depicted in FIG. 8, the data base records 601 are then updated with the location and zone information. The system management software is now aware that zone 1 (with CRAC 1) has machines M1, M3, M5, M6, and zone 2 (with CRAC 2) contains M2, M7 and M4 (as shown in FIG. 8). Advantageously, if M1 exceeds its thermal budget, workload can be shifted to a machine that is in a different zone, such as M4.

Figure 9A:
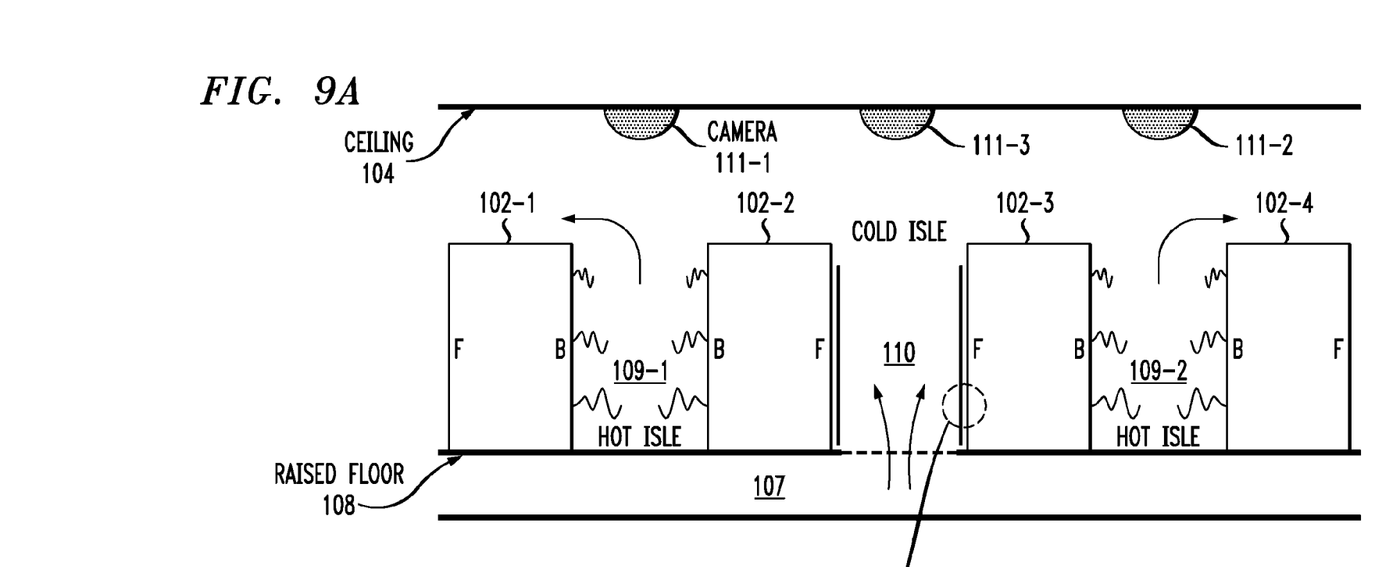
FIG. 9A illustrates a data center in which equipment location identification is implemented according to another embodiment of the invention.
Figure 9B:
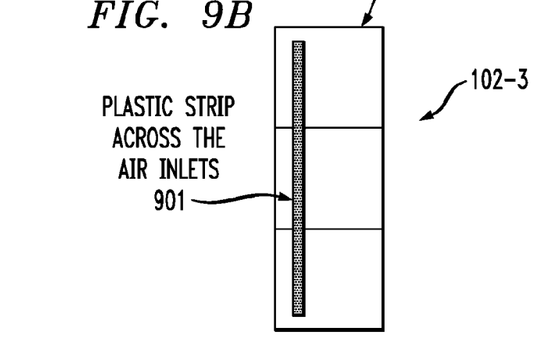
FIG. 9B illustrates air inlets and a plastic strip for use in accordance with the embodiment of FIG. 9A.

Beside location detection, thermal camera can also be used for other purposes such as troubleshooting and prevention. By measuring the exhaust temperatures of the same job running at different time, it is possible to detect any anomalies in the operating condition of the machine and forewarn users about an impending malfunction. For example, thermal camera can be used to spot-measure local temperatures for thermally balancing the data center, especially after installation of new equipment. For this type of application, the temperature of the inlet air on the front of the server can be measured with by thermal camera 111-3 in FIG. 9A that takes an image of a narrow plastic strip 901 running across the inlet air vents of the server, as shown in FIG. 9B.

Figure 10:
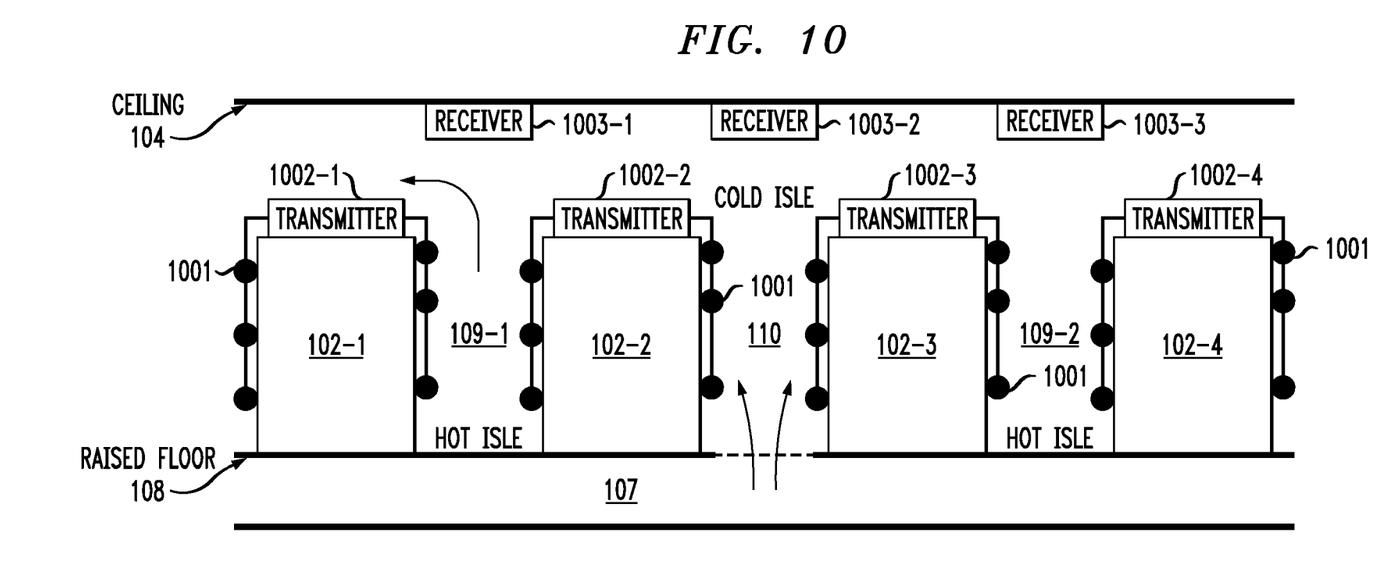
FIG. 10 illustrates a data center in which equipment location identification is implemented according to yet another embodiment of the invention.

In rare cases that cameras cannot be installed, the location algorithm can be implemented with a network of temperature sensors as shown in FIG. 10. As shown, temperature sensors 1002 are placed at the exhaust vents and/or inlet vents of the servers. Multiple sensors can share a directional transmitter (1002-1 through 1002-4), i.e., infrared or microwave. Receivers (1003-1 through 1003-3) are installed on the ceiling or at any high position that is in the line-of-sight with the transmitters. By the well-known method of triangulation, the location of the rack with respect to the room can be measured. By using the location algorithm, the location of individual equipment within the rack can be determined.

Figure 11:
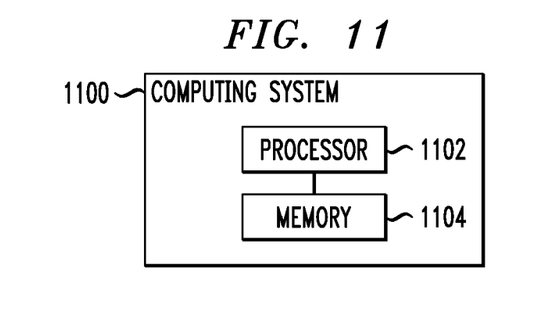
FIG. 11 illustrates a computing system for executing a location algorithm according to an embodiment of the invention.

FIG. 11 illustrates a computing system 1100 for executing a location algorithm according to an embodiment of the invention. One or more software programs for implementing a location algorithm as described herein may be stored in memory 1104 and executed by processor 1102. Memory 1104 may therefore be considered a processor-readable storage medium. Processor 1102 may include one or more integrated circuits, digital signal processors, computer systems, or other types of processing devices, and associated supporting circuitry, in any combination.

Accordingly, as illustratively described herein, principles of the invention provide many advantages. For example, principles of the invention provide a non-invasive method to determine the location of equipment in a data center using thermal or optical camera with very little user interaction. Also, principles of the invention provide a method to infer location information by overlaying sensor data and facility blueprints. A method to detect a pending malfunction by measuring exhaust temperature is also provided. Still further, principles of the invention provide a method to determine the location of equipment by using a network of temperature sensors connected to an infrared transmitter.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of identifying locations of a plurality of computing devices in a computing environment, comprising the steps of:
   generating a first temperature-indicative map of the plurality of computing devices while the plurality of computing devices is in a first mode;
   overlaying the first temperature-indicative map with a facility map associated with the computing environment;
   placing a first one of the plurality of computing devices into a second mode;
   generating a second temperature-indicative map of the plurality of computing devices while the first one of the plurality of computing devices is in the second mode and the remainder of the plurality of computing devices is in the first mode;
   overlaying the second temperature-indicative map with the facility map associated with the computing environment; and
   comparing the first temperature-indicative map with the second temperature-indicative map to determine a location of the first one of the plurality of computing devices.

2. The method of claim 1, wherein the first mode is one of a normal operating mode and an idle mode, and the second mode is the other of the normal operating mode and the idle mode.

3. The method of claim 1, further comprising the step of iteratively cycling each of the remaining computing devices from the first mode to the second mode such that first and second temperature-indicative maps can be obtained and compared from which locations of each of the remaining computing devices can be determined.

4. The method of claim 1, given the determined location of the first one of the plurality of computing devices, the method further comprising the steps of obtaining a thermal image of another portion of the first one of the plurality of computing devices, and taking at least one action with respect to the first one of the plurality of computing devices based on the obtained thermal image.

5. The method of claim 1, wherein, given the determined location of the first one of the plurality of computing devices, a power management operation is performed.

6. The method of claim 1, wherein, given the determined location of the first one of the plurality of computing devices, a troubleshooting operation is performed.

7. The method of claim 1, wherein the respective steps of generating the first and second temperature-indicative maps of the plurality of computing devices further comprises using at least one thermal imaging device to capture the first and second temperature-indicative maps.

8. The method of claim 7, wherein the first and second temperature-indicative maps comprise respective thermal images taken by the at least one thermal imaging device of temperature conditions of heat-conducting elements attached to exhaust fans of the plurality of computing devices.

9. The method of claim 8, wherein the heat-conducting elements are plastic strips.

10. The method of claim 9, wherein, when a computing device comprises more than one exhaust fan, the corresponding plastic strips are distinguishable from one another based on at least one of unique shapes and unique sizes.

11. The method of claim 1, wherein the first temperature-indicative map of the plurality of computing devices is generated when each of the plurality of computing devices is in the first mode.

12. The method of claim 1, wherein the respective steps of generating the first and second temperature-indicative maps of the plurality of computing devices further comprises using at least one optical imaging device to capture the first and second temperature-indicative maps.

13. The method of claim 12, wherein the first and second temperature-indicative maps comprise respective optical images of positions of elements mounted near exhaust fans of the plurality of computing devices.

14. Apparatus for identifying locations of a plurality of computing device in a computing environment comprising:
   a memory; and
   at least one processor coupled to the memory and operative to: (i) generate a first temperature-indicative map of the plurality of computing devices while the plurality of computing devices is in a first mode; (ii) overlay the first temperature-indicative map with a facility map associated with the computing environment; (iii) place a first one of the plurality of computing devices into a second mode; (iv) generate a second temperature-indicative map of the plurality of computing devices while the first one of the plurality of computing devices is in the second mode and the remainder of the plurality of computing devices is in the first mode; (v) overlay the second temperature-indicative map with the facility map associated with the computing environment; and (vi) comparing the first temperature-indicative map with the second temperature-indicative map to determine a location of the first one of the plurality of computing devices.

15. The apparatus of claim 14, wherein the first mode is one of a normal operating mode and an idle mode, and the second mode is the other of the normal operating mode and the idle mode.

16. The apparatus of claim 14, further comprising the step of iteratively cycling each of the remaining computing devices from the first mode to the second mode such that first and second temperature-indicative maps can be obtained and compared from which locations of each of the remaining computing devices can be determined.

17. The apparatus of claim 14, given the determined location of the first one of the plurality of computing devices, the method further comprising the steps of obtaining a thermal image of another portion of the first one of the plurality of computing devices, and taking at least one action with respect to the first one of the plurality of computing devices based on the obtained thermal image.

18. The apparatus of claim 14, wherein, given the determined location of the first one of the plurality of computing devices, a power management operation is performed.

19. The apparatus of claim 14, wherein, given the determined location of the first one of the plurality of computing devices, a troubleshooting operation is performed.

20. An article of manufacture for identifying a plurality of computing devices in a computing environment, comprising a computer readable storage medium containing one or more programs which when executed by a computer implement the steps of:

generating a first temperature-indicative map of the plurality of computing devices while the plurality of computing devices is in a first mode;

overlaying the first temperature-indicative map with a facility map associated with the computing environment;

placing a first one of the plurality of computing devices into a second mode;

generating a second temperature-indicative map of the plurality of computing devices while the first one of the plurality of computing devices is in the second mode and the remainder of the plurality of computing devices is in the first mode;

overlaying the second temperature-indicative map with the facility map associated with the computing environment; and comparing the first temperature-indicative map with the second temperature-indicative map to determine a location of the first one of the plurality of computing devices.

* * * * *